United States Patent [19]
Guzinski et al.

[11] Patent Number: 5,332,996
[45] Date of Patent: Jul. 26, 1994

[54] METHOD AND APPARATUS FOR ALL CODE TESTING

[75] Inventors: Miroslaw Guzinski, Lawrenceville; James L. Lewandowski, Plainsboro; Victor J. Velasco, Montgomery; Shianling Wu, Lawrenceville, all of N.J.

[73] Assignee: AT&T Bell Laboratories, Murray Hill, N.J.

[21] Appl. No.: 84,855

[22] Filed: Jun. 30, 1993

[51] Int. Cl.[5] .............................................. H03M 1/10
[52] U.S. Cl. .................................................. 341/120
[58] Field of Search ........................................ 341/120

[56] References Cited

U.S. PATENT DOCUMENTS

| | | | |
|---|---|---|---|
| 3,154,738 | 10/1964 | Greene, Jr. et al. | 341/120 |
| 3,603,772 | 9/1971 | Allen | 341/120 |
| 3,816,813 | 6/1974 | Jehu | 341/120 |
| 4,340,856 | 7/1982 | Orlandi | 341/120 |
| 4,616,329 | 10/1986 | Abrams et al. | 341/120 |
| 5,132,685 | 7/1992 | DeWitt et al. | 341/120 |

FOREIGN PATENT DOCUMENTS

| | | | |
|---|---|---|---|
| 56-126319 | 10/1981 | Japan | 341/120 |
| 61-137429 | 6/1986 | Japan | 341/120 |

OTHER PUBLICATIONS

Havener, *Catch Missing Codes,* Electronic Design 16, Aug. 11975, pp. 58–64.
Sellier, Analog-to-Digital Converter Automatic Tester, IBM Technical Disclosure Bulletin vol. 22 No. 3 Aug. 1979, pp. 1039–1040.

Primary Examiner—Howard L. Williams
Attorney, Agent, or Firm—Robert B. Levy

[57] ABSTRACT

A device (12), such as an A/D converter for generating successive codes, each in accordance with the level of an input analog voltage, may be tested to determine if all codes have been generated by applying a voltage $V_t$ having an amplitude that varies between 0 and V volts. The variation in the voltage $V_t$ is such that when the device (12) is operating properly, it will generate all of its codes during a predetermined interval. Each code generated by the device (12) is compared by a comparator (18) to the count of an n-bit counter (20) whose count is initialized at zero. Each time the count of the counter (20) matches the code produced by the device (12), the counter is incremented. If the counter overflows (i.e., its count has exceeded $2^n - 1$) within a prescribed interval, then the device (12) is said to be operating properly.

9 Claims, 1 Drawing Sheet

METHOD AND APPARATUS FOR ALL CODE TESTING

TECHNICAL FIELD

This invention relates to a testing technique for detecting the presence of all codes generated by a device such as an Analog-to-Digital (A/D) converter or the like.

BACKGROUND OF THE INVENTION

Digital circuitry has supplanted analog circuitry in many electronic systems, especially those used in data processing and telecommunications. Within such digital systems, there is often a need to process one or more analog signals, such as an analog video or voice signal, which may vary from 0 to V volts. To facilitate the processing by digital circuit elements within the electronic system, the analog signal is converted to a corresponding digital signal by an Analog-to-Digital (A/D) converter which serves to generate a digital word (i.e., a code) corresponding to the amplitude of the analog signal at a given instant. To more fully approximate the analog signal, the A/D converter samples the analog signal periodically. Such A/D converters are well known in the art.

The functionality of the A/D converter depends on its ability to generate all possible codes, (i.e., all $2^n$ codes for an n-bit-wide A/D converter). In other words, the A/D converter should be capable of converting any analog voltage between 0 and V volts into the corresponding digital code. Failure of the A/D converter to convert a particular analog voltage to the corresponding digital code represents a fault (i.e., an error) which affects the A/D converter operation. To date, there has not been an efficient scheme for accomplishing built-in, self-testing of an A/D converter or a similar type of device to determine its ability to generate all possible codes.

Thus there is a need for a technique for accomplishing built-in self-testing of an A/D converter or the like to determine its ability to generate all possible digital codes.

SUMMARY OF THE INVENTION

Briefly, in accordance with the invention, a technique is disclosed for accomplishing all code testing of a device such as an A/D converter, and preferably, a technique for accomplishing built-in, self-testing of such an A/D converter or the like. The method is practiced by applying to the A/D converter a voltage which varies such that the A/D converter, when operating properly, will produce a separate one of all of its codes often enough for testing purposes. In other words, the input voltage will vary from 0 to V such that the voltage takes on each of those values which will cause the A/D converter to generate each of its codes at least once. The output of the A/D converter is compared to the output of a counter which is operative to monotonically increase its count (initialized to zero) each time the output code of the A/D converter equals the count of the counter. For each value of its input voltage, the A/D converter, when operating properly, will generate a corresponding one of its different codes. As described, the counter is incremented only when the A/D converter code equals the counter count. Thus, if the counter counts one beyond its prescribed count ($2^n-1$, related to n, the width of the A/D converter) within a predetermined interval, then the A/D converter has generated all of its codes and is therefore functioning properly.

The elements necessary to carry out the method of the invention (i.e., a comparator and a counter) can be packaged together with the A/D converter. In this way, the A/D converter may be rendered capable of built-in self-testing.

DETAILED DESCRIPTION

Figure 1:
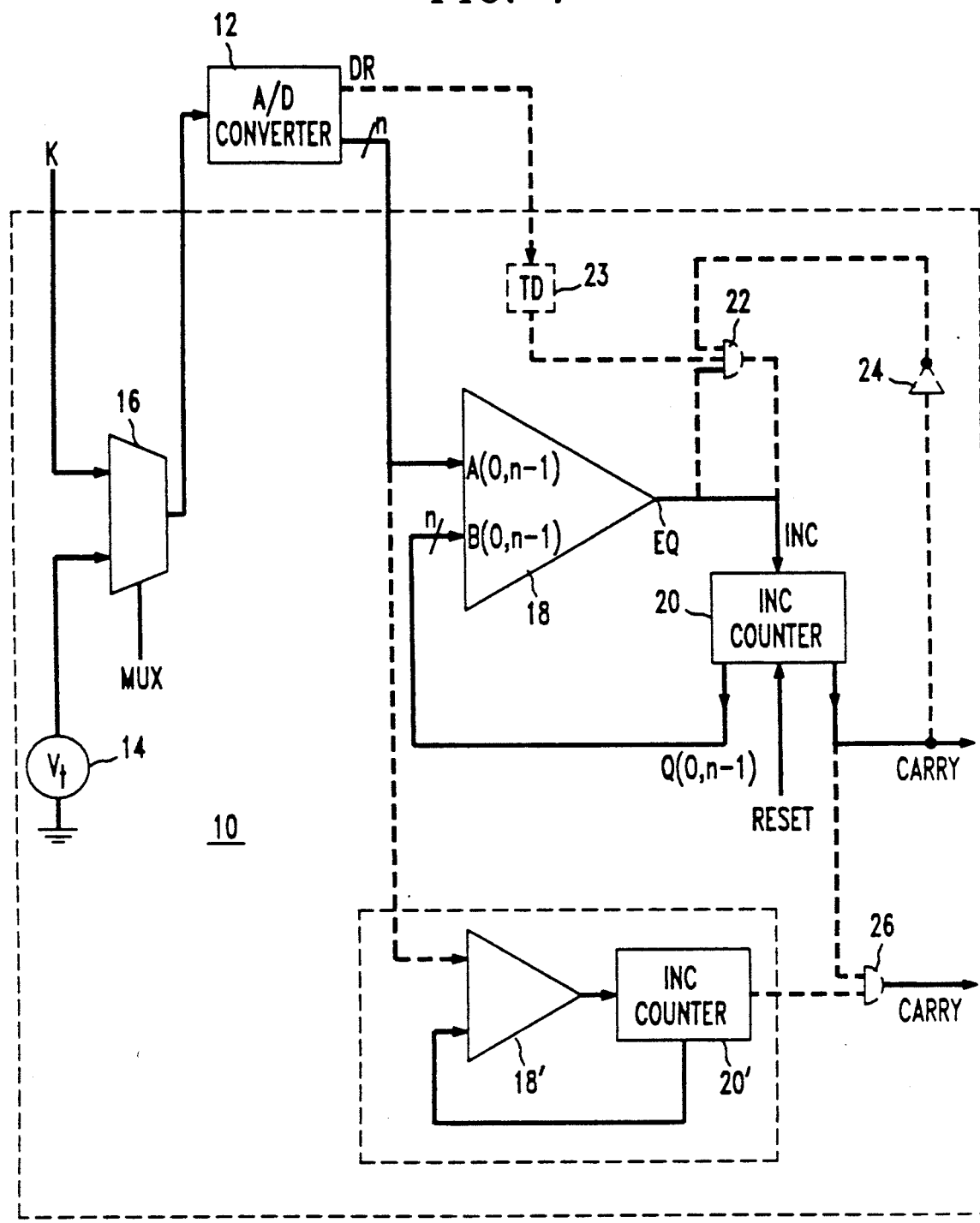
FIG. 1 is a block schematic diagram of an apparatus, in accordance with the invention, for testing whether an A/D converter has generated all of its possible codes.

Referring to FIG. 1, there is shown an apparatus 10, in accordance with the invention, for testing an n-bit-wide A/D converter 12 (or a similar device which generates all $2^n$, n-bit-wide codes) to determine whether the device is capable of generating all of its possible codes. The apparatus 10 includes a voltage source 14 for generating an analog voltage $V_t$ which varies between 0 and V volts. The voltage $V_t$ varies in a manner such that the A/D converter 12, when operating properly, will generate each of the possible codes sufficiently often for testing purposes during a prescribed period. For example, the voltage source 14 could be configured so that the voltage $V_t$ has a sinusoidal or sawtooth waveform. Alternatively, the voltage source 14 could simply be a white noise generator. All that is necessary is for the voltage $V_t$ to vary between 0 and V so that every analog voltage matching a corresponding code of the A/D converter 12 appears sufficiently often in a given interval.

A multiplexer 16 is provided to multiplex the output voltage $V_t$ from the voltage source 14 with an analog signal K normally supplied to the A/D converter 12 during non-built-in, self-test intervals (i.e., normal operation). The multiplexer 16 is controlled by a signal MUX such that during built-in self-test intervals, the A/D converter 12 is supplied with the voltage $V_t$. Conversely, during non-built-in, self-test intervals, the A/D converter 12 is supplied with the signal K.

The A/D converter 12 has its output connected to a first input A[0,n−1] of an n-bit-wide comparator 18 that compares the A/D converter code received at its first input to a code that is received at its second input B[0,n−1]. When the codes received at the inputs A[0,n−1] are equal, the comparator 18 generates a logic "high" or "1" level signal at its output EQ. Conversely, if the signals at its inputs A[0,n−1] and B[0,n−1] are not equal, the comparator 18 generates a logic "low" or "0" level signal at its output EQ.

The comparator 18 has its output EQ coupled to an increment input INC of an increment (i.e., count-up) counter 20. For so long as the signal at its INC input remains at a logic "high" or "1" level, the counter 20 successively increments its count each time a periodic clock signal, applied to the counter at its clock input (not shown), undergoes an alternation. (If the signal at the INC input of the counter 20 is not at a logic "high" or "1" level, then the counter does not count). Once the counter 20 has counted up to n bits ($111\ldots1_{n-1}$), then, upon the next alternation of the clock signal, the counter 20 generates a logic "high" or "1" level signal (bit) at its CARRY output. The count of the counter 20, which appears at its output Q[0,n−1], is supplied to the second input B[0,n−1] of the comparator 18.

The clock signal supplied to the counter 20 is typically synchronized to the clock signal of the A/D converter 12 in a manner known in the art to avoid a lack of synchronism between the A/D converter and the counter. To assure more complete synchronism between the A/D converter 12 and the counter 20, it may be desirable (although not necessary) to make use of a Data Ready (DR) signal which is produced by the A/D converter to provide an indication of whether conversion of the analog voltage to a corresponding digital code has been completed. In this regard, an AND gate 22 (shown in phantom) may be provided to AND the output signal of the comparator 18 with the DR signal from the A/D converter 12, as delayed by a delay gate 23 (shown in phantom), to obtain a signal supplied to the INC input of the counter 20 in place of the output signal of the comparator 18. If the A/D converter 12 has generated a digital code at its output (as indicated by a logic "high" or "1" level DR signal) and if the comparator 18 has found the now-generated code from the A/D converter to be equal to the count of the counter 20, then the AND gate 22 yields a logic "high" or "1" level signal at its output to enable the counter to be incremented upon the next alternation of its clock signal. While the signal at its INC input remains at a logic "low" or "0" level, the counter 20 is inhibited from counting.

The testing of the A/D converter 10 is carried out in the following manner. At the outset of testing, the counter 20 is reset by the application of a logic "high" or "1" level signal at its reset input so that the counter count is initialized to $000 \ldots 0_{n-1}$. It may be useful to preset the count of the counter to all "1"s and then to clock the counter to make sure that the counter has overflowed and that the counter carry bit has toggled. An appropriate-level MUX signal is then applied to the multiplexer 16 to cause the voltage $V_t$ to be applied to the A/D converter 12 rather than the signal K. In response to the variation in the voltage $V_t$ between 0 and V volts, the A/D converter 12, when operating properly, will generate each of its codes sufficiently often, although not necessarily in succession. Each code generated by the A/D converter 12 is compared by the comparator 18 to the count of the counter 20. When the voltage $V_t$ is at a zero amplitude value, then the A/D converter 12 should generate a count of $000 \ldots 0_{n-1}$, so that the count of the counter 20 should equal the A/D converter output code at this time, causing the counter to be incremented.

When the voltage $V_t$ supplied to the A/D converter 12 reaches a level corresponding to the next successive code (i.e., $000 \ldots 1_{n-1}$) of the A/D converter 12 following $000 \ldots 0_{n-1}$, the A/D converter should generate that code. Under these conditions, the code of the A/D converter 12 and the counter 20 are again equal, causing the counter to again be incremented. As should be appreciated, every time the count of the counter 20 equals the newly-generated code of the A/D converter 12, the counter increments. Since the counter 20 and A/D converter 12 are both n bits wide, the counter thus generates a count of $111 \ldots 1_{n-1}$ when the A/D converter has generated all of its codes but the last one.

Upon the generation by the A/D converter 12 of a code which once again matches the count of the counter 20, then the counter now counts one past its count of $111 \ldots 1_{n-1}$. As a consequence, the counter 20 count reverts to $000 \ldots 0_{n-1}$, and a carry bit, appearing at the CARRY output of the counter, becomes a logic "high" or "1" to signify the presence of an overflow condition. In some instances, it may be desirable to "lock" or otherwise inhibit the counter 20 from further counting once it has overflowed. This may be accomplished by ANDING, at the AND gate 22, the signal at the CARRY output of the counter (as inverted by an inverter 24) together with the output signal of the comparator 18 and the DR signal from the A/D converter 12, as delayed by the delay gate 23.

As indicated, when the A/D converter 12 has generated all of its codes, the signal (i.e., the bit) at the CARRY output of the counter 20 goes to a logic "high" or "1" level. However, the true measure of the functionality of the A/D converter 12 is whether it has generated all of its codes within some prescribed interval, provided that the voltage $V_t$ has varied between 0 and V volts to afford the A/D converter the opportunity to do so. Typically the interval will depend on the variation in $V_t$. For example, if $V_t$ is chosen to have a sinusoidal or sawtooth amplitude, the signal at the CARRY output of the counter 20 should be monitored for at least two complete cycles of $V_t$ to determine if the counter has overflowed, indicating that the A/D converter 12 has generated all of its codes. In the case where $V_t$ has a randomly varying amplitude, some finite interval, say several seconds, should elapse before checking whether the bit at the CARRY output of the counter 20 has changed states in order to determine if the A/D converter 12 has generated all of its codes.

A distinct advantage of the apparatus 10 is that its major elements (i.e., the comparator 18 and the counter 20) can easily be packaged, together with the A/D converter 12, as separate chips within a single package (not shown), or as separate circuits on a single semiconductor (e.g., silicon) substrate (not shown). In this way, the A/D converter 12 can be rendered capable of built-in self-testing. The addition of the comparator 18 and the counter 20 to the A/D converter 12 in the context of a single silicon substrate would only increase the overall overhead by approximately 3% for the situation where n=8.

In some instances where a high degree of fault tolerance is necessary, an advantage can be obtained by providing the apparatus 10 with an additional comparator 18' and an additional counter 20', identical to the comparator 18 and the counter 20, respectively, and coupled together in the same manner. In other words, the comparator 18' receives the output of the A/D converter 12 and the output of the counter 20' at its first and second inputs, respectively. The output of the comparator 18' is coupled to the INC of the counter 20' for incrementing the counter when the signals at the first and second inputs of the comparator are equal. The counter 20' has the output signal at its CARRY output logically ANDED, via an AND gate 26', with the output signal at the CARRY output of the counter 20.

Rather than have the CARRY output of the counter 20 serve as the output of the apparatus 10, now the output of the AND gate 26' serves that function. The AND gate 26' thus provide an output signal at a logic "high" or "1" level only when both of the counters 20 and 20' have overflowed. If the apparatus 10 is defective (i.e., one or more of the comparators 18 and 18' and the counters 20 and 20' have failed), then the output signal provided by the AND gate remains at a logic "low" or "0" level. Therefore, with the addition of the comparator 18' counter 20' and AND gate 26', a failure of the apparatus 10 will not give rise to a "false-positive" testing result of the A/D converter 12.

The foregoing describes a technique for testing an A/D converter 12 (or a similar device which generates sequential codes, but not necessarily in succession) by applying a varying voltage $V_t$ to the A/D converter and then comparing, via a comparator 18, the output code generated by a counter 20 incremented each time the count of the counter and the code of A/D converter are equal. By packaging the comparator 18 and counter 20 together with the A/D converter 12, the A/D converter can be rendered capable of built-in self-testing.

It is to be understood that the above-described embodiments are merely illustrative of the principles of the invention. Various modifications and changes may be made thereto by those skilled in the art which will embody the principles of the invention and fall within the spirit and scope thereof. For example, the invention has been described in terms of positive logic. It should be understood that it could easily be implemented with negative logic.

We claim:

1. A method for testing an n-bit-wide analog-to-digital converter which generates a separate one of a set of codes, each in response to a corresponding amplitude of analog voltage applied thereto, to determine if the converter can generate all of its codes, comprising the steps of:
    (a) applying to the converter a voltage $V_t$ having an amplitude which varies from 0 to V volts over time such that when the converter is operating properly, the applied voltage $V_t$ causes the converter to successively generate all of its codes sufficiently often;
    (b) comparing each code generated by the converter to a count of an n-bit counter initialized at zero;
    (c) incrementing the count of the counter each time the code generated by the converter matches the count of the counter;
    (d) checking, after a prescribed interval, whether the counter has generated a carry bit to signify an overflow condition, which will occur when the converter is operating properly.

2. The method according to claim 1 wherein the voltage $V_t$ is periodic and has a smoothly varying amplitude.

3. The method according to claim 1 wherein the voltage $V_t$ has a randomly varying amplitude.

4. The method according to claim 1 wherein the counter is initialized by applying a reset signal thereto at the outset of operation.

5. Apparatus for testing an n-bit-wide analog-to-digital converter which generates one of a set of codes, each in response to a corresponding amplitude of analog voltage applied thereto, to determine if the converter can generate all of its codes, the apparatus comprising:
    means for supplying to the converter a voltage $V_t$ and having an amplitude which varies from 0 to V volts such that the converter, when operating properly, will generate all of its codes;
    a counter for generating an n-bit count initialized at zero and which increases monotonically each time the counter is incremented, and for generating a carry bit whose state is indicative of whether the count of the counter has been incremented beyond $2^n - 1$ which will occur when the converter is operating properly;
    a comparator for comparing the code generated by the converter to the count of the counter and for incrementing the counter when the counter count and the code produced by the device match.

6. The apparatus according to claim 5 wherein the voltage-supplying means comprises:
    a voltage source for generating a voltage having an amplitude which varies from 0 to V volts; and
    a multiplexer for multiplexing the voltage supplied from the voltage source with a signal K which is normally supplied to the converter during non-testing intervals, so that the converter receives the signal K during non-testing intervals and receives the voltage from the voltage source during testing intervals.

7. The apparatus according to claim 6 wherein the voltage supplied by the voltage source has a smoothly varying amplitude.

8. The apparatus according to claim 5 further including means for inhibiting the counter from counting once its count has gone one beyond $2^n - 1$.

9. The apparatus according to claim 8 wherein said inhibiting means includes a logic gate for combining the output signal of the comparator and the carry bit of the counter to yield an increment signal which causes the counter to be incremented only when the output code of the converter and the counter count match and only when the counter count is less than $2^n$.

* * * * *